(12) United States Patent
Bajoria et al.

(10) Patent No.: US 12,425,035 B2
(45) Date of Patent: Sep. 23, 2025

(54) CIRCUIT WITH TWO DIGITAL-TO-ANALOG CONVERTERS AND METHOD OF OPERATING SUCH THE CIRCUIT

(71) Applicant: NXP B.V., Eindhoven (NL)

(72) Inventors: Shagun Bajoria, Eindhoven (NL); Muhammed Bolatkale, Delft (NL); Lucien Johannes Breems, Waalre (NL); Robert Rutten, Nistelrode (NL); Mohammed Abo Alainein, Rotterdam (NL)

(73) Assignee: NXP B.V., Eindhoven (NL)

( * ) Notice: Subject to any disclaimer, the term of this patent is extended or adjusted under 35 U.S.C. 154(b) by 211 days.

(21) Appl. No.: 18/357,689

(22) Filed: Jul. 24, 2023

(65) Prior Publication Data

US 2024/0048146 A1 Feb. 8, 2024

(30) Foreign Application Priority Data

Jul. 28, 2022 (EP) ..................................... 22187587

(51) Int. Cl.
*H03M 1/06* (2006.01)
*H03M 1/08* (2006.01)
*H03M 1/66* (2006.01)

(52) U.S. Cl.
CPC ......... *H03M 1/0602* (2013.01); *H03M 1/066* (2013.01); *H03M 1/0665* (2013.01); *H03M 1/0673* (2013.01); *H03M 1/08* (2013.01); *H03M 1/66* (2013.01); *H03M 1/662* (2013.01)

(58) Field of Classification Search
CPC ........ H03M 1/14; H03M 1/662; H03M 1/164; H03M 1/742; H03M 1/0673; H03M 1/12; H03M 1/0602; H03M 1/0665; H03M 1/66; H03M 1/066; H03M 1/08
See application file for complete search history.

(56) References Cited

U.S. PATENT DOCUMENTS

| | | | |
|---|---|---|---|
| 6,373,424 B1 * | 4/2002 | Soenen ............... | H03M 1/0673 341/172 |
| 6,839,009 B1 * | 1/2005 | Ali ...................... | H03M 1/1004 341/172 |
| 10,432,210 B1 | 10/2019 | Yendluri et al. | |
| 11,218,158 B1 | 1/2022 | Patil et al. | |

(Continued)

OTHER PUBLICATIONS

Celin, A., "A Reduced Hardware Complexity Data-Weighted Averaging Algorithm with no tonal behavior", 2016 IEEE International Symposium on Circuits and Systems (ISCAS), May 22-25, 2016.

(Continued)

*Primary Examiner* — Khai M Nguyen

(57) ABSTRACT

A circuit 100 is described comprising (i) a first digital-to-analog converter 110, (ii) a second digital-to-analog converter 111, (iii) a plurality of unit elements 120, and (iv) switching circuitry 130. The switching circuitry 130 is adapted so that in a first switching state 231, a set of unit elements 221 of the plurality of unit elements 120 forms part of the first digital-to-analog converter 110, and in a second switching state 232, the set of unit elements 221 forms part of the second digital-to-analog converter 111. Furthermore, a corresponding method of operating a circuit 100 is described.

20 Claims, 5 Drawing Sheets

(56) References Cited

U.S. PATENT DOCUMENTS

2018/0302100 A1 10/2018 Engel et al.
2019/0165820 A1 5/2019 Xu et al.

OTHER PUBLICATIONS

Cheng, L., "Nyquist-Rate Time-Interleaved Current-Steering DAC with Dynamic Channel Matching", 2011 IEEE International Symposium on Circuits and Systems (ISCAS), May 15, 2011.
Fradette, F., "Dynamic Stage Element Matching (DSEM) in Pipeline Analog to Digital Converters (ADC)", 2012 International Conference on IC Design & Technology (ICICDT), May 30, 2012.
Galton, I., "Why Dynamic-Element-Matching DACs Work", IEEE Transactions on Circuits and Systems—II: Express Briefs, vol. 57, No. 2, Feb. 2010.
Ko, C., "A DEM Scheme for I/Q Mismatch Compensation in Multi-Bit CT ΔΣ Modulator", IEEE International Symposium on Circuits and Systems, ISCAS 2007, May 27, 2007.
Manivannan, S., "A 65-nm CMOS Continuous-Time Pipeline ADC Achieving 70-dB SNDR in 100-MHz Bandwidth", IEEE Solid-State Circuits Letters, vol. 4, Apr. 8, 2021.
Murakami, M., "Linearity Enhancement Algorithms for 1-Q Signal Generation—DWA and Self-Calibration Techniques-", 2015 IEEE 11th International Conference on ASIC (ASICON), Nov. 3, 2015.
Neitola, M., "A Generalized Data-Weighted Averaging Algorithm", IEEE Transactions on Circuits and Systems—II: Express Briefs, vol. 57, No. 2, Feb. 2010.
Radke, R., "A Spurious-Free Delta-Sigma DAC Using Rotated Data Weighted Averaging", Proceedings of the IEEE 1999 Custom Integrated Circuits Conference, May 19, 1999.
Rakuljic, N., "Tree-Structured DEM DACs with Arbitrary Numbers of Levels", IEEE Transactions on Circuits and Systems—I: Regular Papers, vol. 57, No. 2, Feb. 2010.
Shibata, H., "An 800MHz-BW VCO-Based Continuous-Time Pipelined ADC with Inherent Anti-Aliasing and On-Chip Digital Reconstruction Filter", 2020 IEEE International Solid-State Circuits Conference (ISSCC), Feb. 16-20, 2020.
Vadipour, M., "Techniques for Preventing Tonal Behavior of Data Weighted Averaging Algorithm in Σ—Δ Modulators", IEEE . on Circuits and Systems—II: Analog and Digital Signal Processing, vol. 47, No. 11, Nov. 2000.
Welz, J., "Simplified Logic for First-Order and Second-Order Mismatch-Shaping Digital-to-Analog Converters", IEEE Transactions on Circuits and Systems—II: Analog and Digital Signal Processing, vol. 48, No. 11, Nov. 2001.
U.S. Appl. No. 18/310,184, filed May 1, 2023, entitled "Operating an Analog-To-Digital Converter Device".

\* cited by examiner

CIRCUIT WITH TWO DIGITAL-TO-ANALOG CONVERTERS AND METHOD OF OPERATING SUCH THE CIRCUIT

TECHNICAL FIELD

The present disclosure relates to circuits comprising at least two digital-to-analog converters and methods of operating such circuits. Accordingly, the present disclosure may refer to the technical field of digital-to-analog and analog-to-digital signal conversion.

TECHNICAL BACKGROUND

Mismatches in elements of digital-to-analog converters (DAC) introduced during circuit fabrication, make the DAC output levels deviate from their nominal values. As one exemplary application, continuous time (CT) pipeline converters are very sensitive to the errors arising from the DACs of the front-end stages. Mismatch in the DAC elements will cause harmonic distortion and leak the quantization errors of the front-end stages to the output. This will degrade the linearity performance of the converter. Achieving high linearity of the CT pipeline converter requires precise matching of the DAC elements.

Several techniques exist to linearize the transfer function of the DAC, such as dynamic element matching, DEM, in which the DAC is built from unit elements and the DAC elements are selected randomly for each input code to break the correlation between the DAC error and its input. As a result, the harmonic distortion introduced by the DAC is transformed into white noise. Nonetheless, the error power lying within the signal band will increase the noise floor of the converter. Many other techniques exist for the selection of the DAC elements, such as data weighted averaging, DWA, where the DAC elements are selected rotationally such that the power of the DAC error is shifted to higher frequencies in order to minimize the increase of the in-band noise floor of the converter.

OBJECT AND SUMMARY OF THE DISCLOSURE

An object of the present disclosure is to improve on existing techniques or to provide alternative techniques for mitigating errors arising from mismatches between DAC elements, in particular for circuits which comprise more than one DAC.

In order to achieve this object, a circuit comprising two DACs and a method of operating such a circuit according to the independent claims are provided.

According to an aspect of the present disclosure, a circuit is provided comprising (i) a first digital-to-analog converter, (ii) a second digital-to-analog converter, (iii) a plurality of unit elements, and (iv) switching circuitry. The switching circuitry is adapted so that in a first switching state, a set of unit elements of the plurality of unit elements (functionally) forms part of the first digital-to-analog converter, and in a second switching state, the set of unit elements (functionally) forms part of the second digital-to-analog converter.

According to a further aspect of the present disclosure, a method of operating a circuit is disclosed, wherein the circuit comprises a plurality of digital-to-analog converters, a plurality of unit elements and switching circuitry. The method comprises the steps of: (i) setting the switching circuitry to a first switching state so that a set of unit elements of the plurality of unit elements (functionally) forms part of a first digital-to-analog converter of the plurality of digital-to-analog converters; and (ii) setting the switching circuitry to a second switching state so that the set of unit elements (functionally) forms part of a second digital-to-analog converter of the plurality of digital-to-analog converters.

In the context of the present disclosure, a "digital-to-analog converter, DAC" may particularly refer to a device that converts a digital input signal, e.g. a signal encoding a binary input number, to an analog output signal. The circuit may comprise a plurality of DACs including the first and second DACs. A DAC may have one of several DAC architectures. The suitability of a specific DAC architecture, in particular for a given application, may be determined by at least one of a resolution, a maximum sampling frequency, and an error introduced in the signal conversion. The resolution of a DAC may be given by a number of bits processed by the DAC. The resolution may be the smallest increment of output that the DAC can produce.

In the context of the present disclosure, a "unit element" may particularly refer to an electric or electronic component forming part of a digital-to-analog converter. The digital-to-analog converter may comprise a plurality of unit elements. The unit elements may be used to analyze an input signal, in particular to determine a value of a digital input signal and/or to transform the digital input signal into an analog output signal. Different unit elements may have a similar or identical structure and/or a similar or identical function. The unit elements of a digital-to-analog converter may also differ from each other.

A unit element may comprise at least one of a current source, a resistor, and a capacitor. Different unit elements, even though having an identical or similar design, may deviate from each other, e.g. due to variances introduced during the manufacture of the unit elements. These variances may be referred to as "mismatch" between unit elements. The number of unit elements in the circuit may depend on the number of digital-to-analog converters of the circuit and on the number of bits processed by each digital-to-analog converter, in particular each front-end digital-to-analog converter.

Mismatches between unit elements may result in different kinds of errors, in particular a "gain error" of a respective DAC and an "integral non-linearity (INL) error" of the respective DAC. The gain error may relate to the deviation from the ideal slope of the transfer function of the DAC, wherein the transfer function may relate to the relationship between an input value of an input signal and an output voltage or current. Integral non-linearity may be a specification or measure of how and/or to what extent the linearity of the measured/actual transfer function differs with respect to the ideal transfer function.

In the context of the present disclosure, the expression "a unit element forming part of a DAC" may particularly refer to the unit element structurally and/or functionally forming part of the DAC. The unit element may contribute to the functionality of the DAC, in particular it may be required for analyzing an input signal of the DAC, e.g. for determining the input value of the input signal, and/or for transforming the digital input signal into an analog output signal. One or more of the unit elements may be required for the digital-to-analog conversion provided by the DAC.

In the context of the present disclosure, a "set of unit elements" may particularly refer to a number or amount of unit elements. The set of unit elements may be a non-zero set of unit elements. In other words, it may comprise at least one unit element. The set may comprise one, two, three, four, five, more than five or more than ten unit elements. The "size" of the set may refer to the number of unit elements in the set or the cardinality of the set. The size of the set may depend on or be determined by a resolution of the respective DAC. The size of the set may depend on or be determined by the input signal received by the DAC, in particular by the number of bits encoded by the input signal. For example, the size of the set may be $2^n-1$ with n being the number of bits processed by the DAC, i.e. the number of bits of the input signal. When the set of unit elements forms part of a DAC, this may refer to all of the unit elements of the set forming part of the DAC or it may refer to only part of the unit elements of the set forming part of the DAC, while the remaining ones are merely assigned to the DAC for bookkeeping reasons. The whole set may be merely assigned for bookkeeping reasons. The switching circuitry may connect to the respective DAC only the part of the unit elements of the set forming part of the DAC, but not those merely assigned for bookkeeping reasons.

In the context of the present disclosure, "switching circuitry" may particularly refer to any circuitry comprising one or more switching devices, e.g. electronic switches. A switching device may be configured to interrupt an electric current and/or divert a current from one conductor to another. The switching circuitry may be configured to guide, by means of one or more electric conductors, current between one or more unit elements and one or more DACs. The switching circuitry may connect, in a respective switching state, the unit elements of the set of unit elements to the respective DAC.

The switching circuitry may be configured to assume a plurality of "switching states", including at least the first and the second switching state. The switching states may differ in the state of at least one of the switching devices of the switching circuitry. The switching states of the plurality states may be only those which are actually assumed during operation of the circuit. A switching device may for example have an "on"-state, where current passes through the switch, and an "off"-state, where current is blocked by the switch. Alternatively or in addition, the electronic switch may assume different states, for which current passes between different pairs of conductors connected to the switch.

According to an exemplary embodiment, the present disclosure may be based on the idea to provide a circuit comprising at least two DACs, wherein errors of the different DACs can be controlled or mitigated, in particular where differences in errors between the DACs can be controlled or mitigated. For example, certain types of errors introduced by the DACs such as gain errors may be controlled so that they are equal on average. Alternatively or in addition, deviations from average errors may be controlled, e.g. may be noise-shaped or may be turned into white noise. Respective errors such as a gain error or an INL error of a DAC may depend on the unit elements forming part of the DAC. The errors may result from mismatches between different unit elements, in particular from mismatches between unit elements forming part of different DACs of a circuit. By assigning one or more unit elements to different DACs in corresponding switching states of a switching circuitry, i.e. by swapping at least one unit element between different DACs, differences between errors of different DACs may be controlled in the above-described ways.

This approach may for example be advantageous if the circuit is a continuous time pipeline converter. It may allow to noise shape, in particular first order noise shape, both the INL and gain errors of the front-end DACs in the continuous time pipeline converter. It may allow to control or improve the linearity performance of DACs forming part of such pipeline converters. In particular, in continuous time pipeline architectures, the linear gain errors of the DACs of the different front-end stages of the pipeline may leak the quantization error of corresponding ADCs to the output and thereby degrade linearity performance. Thus, the linearity performance of circuits such as pipeline converters may be improved by assigning a set of unit elements to a first DAC at a first instance, i.e. a first switching state, and then to a second DAC at a second instance, i.e. a second switching state.

DESCRIPTION OF EXEMPLARY EMBODIMENTS

In the following, further exemplary embodiments of the circuit and the corresponding method of operating the circuit will be explained.

According to an exemplary embodiment, each of the unit elements of the plurality of unit elements comprises at least one electric component, in particular at least one of a current source, a resistor, and a capacitor. In addition, each of the unit elements may comprise one or more switches.

The electric components may contribute to the function of the unit element, in particular the function of the unit element within the respective digital-analog converter. The electric component may be required for converting a digital input signal into an analog output signal.

According to a further exemplary embodiment, the circuit is a (continuous time) pipeline converter, wherein the first digital-to-analog converter forms part of a first (front-end) stage of the pipeline converter and the second digital-to-analog converter forms part of a second (front-end) stage of the pipeline converter. Each of the digital-to-analog converters of a plurality of digital-to-analog converters of the circuit may form part of a respective (front-end) stage of the pipeline converter. There may be further digital-to-analog converters of the circuit, which do not form part of front-end stage. Also, at least one of the (front-end) stages may comprise more than one digital-to-analog converter.

In the context of the present disclosure, the term "pipeline converter" may particularly refer to an analog-to-digital converter (ADC) comprising a plurality of stages including at least a first stage and a second stage. The stages may be front-end stages in distinction from one or more back-end stages arranged after the plurality of front-end stages. Each of the plurality of (front-end) stages may, but need not have an identical or similar structure. For example, each of the plurality of (front-end) stages may comprise a respective analog-to-digital converter as well as a respective digital-to-analog converter. The different stages may analyze an incoming overall input signal of the pipeline converter at different resolutions. To this effect, each stage may output a respective residual signal subtracting the signal output of the DAC of the stage from a delayed input signal of the stage. The residual signal may serve as input signal for the subsequent stage.

Assigning the same set of unit elements to different DACs of a pipeline converter may be advantageous because pipeline converters may be particularly sensitive to gain errors arising from mismatches in DAC elements at front-end stages of the pipeline converter. Precise matching of the DAC elements may contribute to achieving high linearity of the pipeline converter. In other words, mismatches between DAC unit elements of different stages can be controlled by assigning the same set of unit elements to different DACs at different times by means of switching circuitry.

According to a further exemplary embodiment, a size of the set of unit elements is indicative of or determined by a number of bits processed by the first digital-to-analog converter and/or by the second digital-to-analog converter.

The number of bits processed by a DAC may refer to the number of bits encoded in the digital input signal received by the DAC. Assigning a set of unit elements of such a size to different DACs may be advantageous to effectively control errors of different DACs such as gain errors. The above-described embodiment may be advantageous with regard to the efficiency of employed error-control algorithms.

According to a further embodiment, the size of the set of unit elements equals two to the power of the number of bits processed by the first DAC minus one. In general, the size of the set of unit elements forming part of a respective DAC may equal two to the power of the number of bits processed by the respective DAC minus one. The number of bits processed by a DAC may correspond to the number of bits encoded in the input signal of the DAC.

According to a further embodiment, the plurality of unit elements is partitioned into a plurality of fixed sets of unit elements, in particular of the same size, and wherein for each switching state of the switching circuitry (including the first and second switching states), each of the fixed sets of unit elements forms part of a respective digital-to-analog converter. The plurality of fixed sets of unit elements includes the set of unit elements. These fixed sets of unit elements may be representable as different rows of a unit element matrix. A first row of the matrix may list the set of elements forming part of the first DAC, a second row of the matrix may list the further set of elements forming part of the second DAC, and further rows the respective sets of elements forming part of further DACs. In different switching states, rows of the unit element matrix may be swapped.

According to a further exemplary embodiment, the circuit further comprises at least one further digital-to-analog converter, wherein the switching circuitry is adapted so that, for each further digital-to-analog converter, the set of unit elements forms part of the further digital-to-analog converter in a respective further switching state of the switching circuitry.

Such an embodiment may be advantageous to control errors such as gain errors of more than two DACs of a circuit, in particular differences between these errors. For example, the errors may be controlled such that they are equal on average for all DACs. The differences in errors may result from mismatches in unit elements of the different DACs. The further digital-to-analog converters may for example form part of a third (front-end) stage and of respective further (front-end) stages of a pipeline converter. The above-described embodiment may be advantageous to ensure sufficient linearity even for pipeline converters with high resolution. Differences in gain errors may be problematic only for pipeline converters with more than two stages.

According to an exemplary embodiment, the number of unit elements included in the circuit is determined by the number of digital-to-analog converters included in the circuit, e.g. the number of DACs in front-end stages of a pipeline converter, and the number of bits processed by each digital-to-analog converter.

According to a further exemplary embodiment, the set of unit elements forming part of the first digital-to-analog converter in the first switching state is selected, in particular selected by a control device, based on an input value of an input signal received by the first digital-to-analog converter and/or based on an input value of an input signal received by a first stage of a pipeline converter. The input signal may be a digital input signal. The selection may be determined by a control device and/or implemented by the switching circuitry. For example, the fixed set of elements forming part of the first DAC may be selected based on the input value, wherein the fixed set of elements may correspond to the first row of a unit element matrix.

A plurality of input signals may be subsequently received by the first digital-to-analog converter. The plurality of input signals may each encode the same number of bits. Each of the plurality of input signals may have a respective input value representable in terms of the number of bits encoded by the input signal. Similarly, respective pluralities of input signals having respective input values may be subsequently received by the second and/or all further digital-to-analog converters. All input signals of the different DACs may encode the same number of bits.

The above-described embodiment may be advantageous to effectively control errors of the first DAC, in particular a gain error and/or an integrated non-linearity error. For example, deviations of an error from an average error value may differ depending on the input value. This may be because the input value determines a number of unit elements required for processing an input signal, while the respective error depends on this number of unit elements. The above-described embodiment may be advantageous for noise-shaping a gain error of the first DAC.

According to a further exemplary embodiment, the set of unit elements forming part of the first digital-to-analog converter in the first switching state is selected based on a previous set of elements, which formed part of the first digital-to analog converter, when a previous input value of a previous input signal was processed by the first digital-to analog converter. The selection may be determined by a control device and/or implemented by the switching circuitry.

The previous input signal may, but need not be the input signal immediately preceding the (present) input signal. Taking into account a previous set of elements may be advantageous for (first order) noise-shaping the gain error of the first DAC. For example, the (present) set of elements may be selected such that a corresponding error, e.g. deviation from an average error, compensates, in particular maximally or optimally compensates, the respective error, e.g. deviation from the average error, resulting from the previous set of elements.

According to a further embodiment, the set of unit elements, in particular the set of unit elements forming part of the first DAC in the first switching state, is selected randomly. In particular, it may be selected independently of a present input value and/or previous input value. Such an embodiment may be advantageous to convert an error or deviations from an average error into white noise.

According to a further exemplary embodiment, the switching circuitry is adapted so that, in the first switching state, a further set of unit elements forms part of the second digital-to-analog converter, wherein the set of unit elements and the further set of unit elements are selected such that a first average error, in particular a first average gain error, of the first digital-to-analog converter equals a second average error, in particular a second average gain error, of the second digital-to-analog converter. The average may be (approximately) equal only when taking into account a sufficiently large number of subsequent input signals of the first DAC and corresponding subsequent input signals of the second DAC. The selection may be determined by a control device and/or implemented by the switching circuitry.

An "average" gain error may refer to the arithmetic average of subsequent gain errors resulting when subsequent input signals are processed by the respective digital-to-analog converter. It may refer to an average over time. Other characteristics of the error distribution such as the type or shape of the distribution or a standard deviation may also be made equal by the selection of the respective sets of elements.

Making gain errors of different DACs equal may help to control the overall error introduced by the circuit. In the context of a pipeline converter, making the gain errors of some or all front-end stages equal may help to minimize the leakage of the front-end quantization errors as will be explained later in connection with FIGS. 2 and 3.

According to a further exemplary embodiment, subsequent sets of unit elements forming part of the first digital-to-analog converter, when subsequent input signals having respective subsequent input values are received by the first digital-to-analog converter, are selected so that respective subsequent deviations from an average error, in particular an average gain error, compensate each other. They may compensate each other more quickly than when subsequent sets are selected randomly. The sets may be selected so that the deviations compensate each other as quickly as possible.

Respective subsequent sets of unit elements forming part of the second digital-to-analog converter and/or of further digital-to-analog converters may be selected in an analogous manner as described above for the first digital-to-analog converter.

The above embodiment may be advantageous in order to noise-shape the error, e.g. first order noise-shape a gain error of the first digital-to-analog converter. This may allow moving at least some of the gain error out of a relevant signal bandwidth, which may in turn improve the signal-to-noise ratio.

According to a further exemplary embodiment, subsequent sets of unit elements forming part of the first digital-to-analog converter, when subsequent input signals having respective subsequent input values are received by the first digital-to-analog converter, are selected to (first order) noise shape the gain error of the first digital-to-analog converter.

Respective subsequent sets of unit elements forming part of the second digital-to-analog converter and/or of further digital-to-analog converters may be selected in an analogous manner as described above for the first digital-to-analog converter.

The above-described embodiment may be advantageous to partly move some of the gain error to a region outside of a signal bandwidth relevant for signal transmission. In this manner, a signal-to-noise ratio may be improved.

According to a further exemplary embodiment, subsequent further sets of unit elements forming part of the second digital-to-analog converter, when subsequent further input signals having respective subsequent further input values are received by the second digital-to-analog converter, are selected randomly, in particular so that the gain error of the second digital-to-analog converter are converted into white noise. The subsequent further input signals may be received by the second DAC at the same time or shortly after respective input signals have been received by the first DAC.

Respective subsequent sets of unit elements forming part of some or all further digital-to-analog converters may be selected in an analogous manner as described above for the second digital-to-analog converter.

Such an embodiment may be algorithmically simple because random selection of sets of elements is simpler than selection algorithms required for noise shaping. Also, difficulties in coordinating the selection of sets of unit elements for the first DAC and for the second DAC may be avoided as will be explained in connection with FIGS. 4 and 5. At the same time, as will be explained in connection with FIGS. 14 to 16, noise shaping the errors of the second DAC or any further DAC does not significantly improve the performance characteristics of a circuit, in particular HDs, SFDR and SNR.

According to a further exemplary embodiment, the switching circuitry is configured to electrically connect the set of unit elements or a part of the set of unit elements to the first digital-to-analog converter in a predetermined order. The order may be changed for subsequent input signals, in particular so that an integral non-linearity (INL) error is noise-shaped or is converted into white noise. Equally, the switching circuitry may be configured to electrically connect the further set of unit elements or a part of the further set of unit elements to the second digital-to-analog converter in a predetermined further order. The further order may be changed for subsequent further input signals so that an integral non-linearity (INL) error of the second digital-to-analog converter is noise-shaped or is converted into white noise. An INL error of any further digital-to-analog converter may be noise-shaped or converted into white noise in a similar manner. The above-described embodiment may be advantageous because gain error and INL errors may be the main errors resulting from mismatches in unit elements of a circuit.

According to a further exemplary embodiment, the circuit further comprises a control device, in particular digital logic circuitry, configured to operate the switching circuitry. The control device may comprise a processor and/or memory. The control device may be configured to operate the switching circuitry so that the effects of gain errors and/or INL error of the plurality of DACs are mitigated. The control device may be configured to effectuate some or all of the above-described selections of sets of elements.

The aspects defined above and further aspects of the present disclosure are apparent from the examples of embodiment to be described hereinafter and are explained with reference to these examples of embodiment. The disclosure will be described in more detail hereinafter with reference to examples of embodiment but to which the disclosure is not limited.

BRIEF DESCRIPTION OF THE DRAWINGS

The illustrations in the drawings are schematic. In different drawings, similar or identical elements may be provided with the same reference signs.

DESCRIPTION OF THE DRAWINGS

Figure 1:
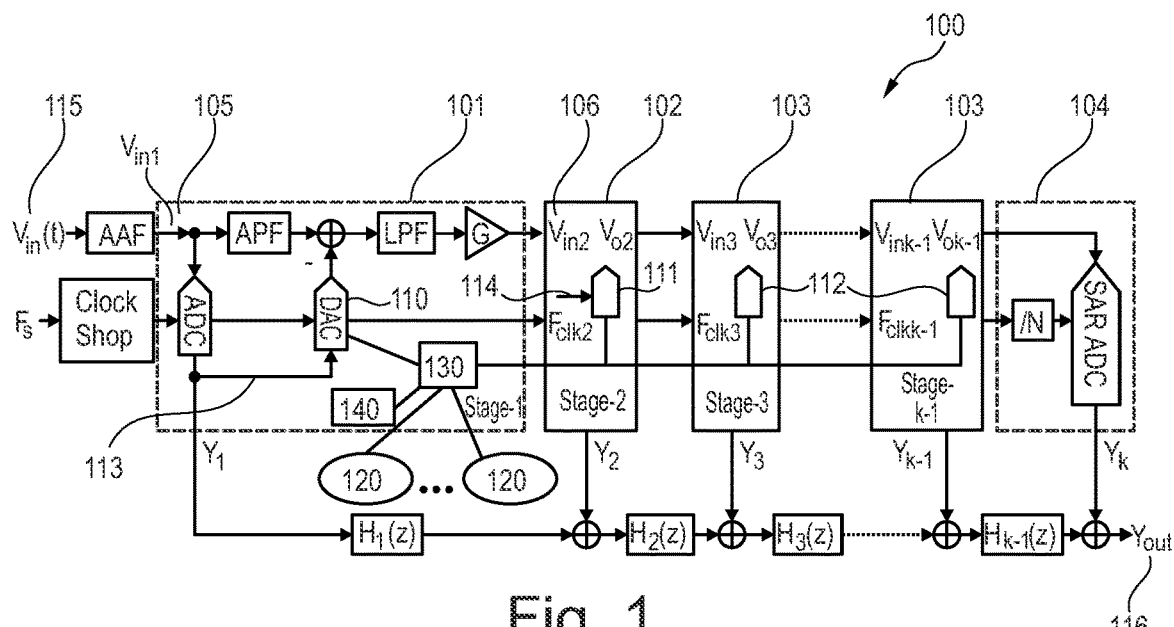
FIG. 1 shows a circuit comprising two digital-to-analog converters according to an exemplary embodiment of the present disclosure.

FIG. 1 shows a circuit 100 comprising a plurality of digital-to-analog converters 110, 111, 112. Specifically, the circuit 100 comprises a first digital-to-analog converter 110, a second digital-to-analog converter 111, a plurality of unit elements 120, and switching circuitry 130. The switching circuitry is adapted so that in a first switching state 231, a set of unit elements 221 of the plurality of unit elements 120 forms part of the first digital-to-analog converter 110, and in a second switching state 232, the set of unit elements 221 forms part of the second digital-to-analog converter 111. To this effect, the switching circuitry 130 is coupled to the first and second digital-to-analog converters 110, 111. The circuit 100 also comprises further digital-to-analog converters 112, which are also coupled with the switching circuitry 130. The switching circuitry is controlled by control device 140.

The circuit 100 shown in FIG. 1 is a continuous time pipeline converter 100 having several front-end stages 101, 102, 103 and a back-end stage 104. Each of the first front-end stage 101, the second front-end stage 102 and the further front-end stages 103 comprise a respective digital-to-analog converter 110, 111, 112. The continuous time pipeline converter 100, which is an analog-to-digital converter, receives an overall input signal 115 or a sequence of overall input signals 115 corresponding to respective first stage input signals 105, second stage input signals 106 as well as overall output signals 116. The first stage input signal 105 is converted by a first analog-to-digital converter to an input signal 113 of the first DAC 110. The second stage input signal 106 is converted by a second analog-to-digital converter to a further input signal 114.

FIG. 1 shows the architecture of a continuous time pipeline converter 100. Each stage 101, 102, 103 consists of a digital to analogue converter (DAC) 110, 111, 112 that generates an analogue output based on the digital input generated by the preceding ADC. The output of the DAC 110, 111, 112 is subtracted from a delayed version of the overall input signal $V_{in}(t)$ to generate a residue signal. The analogue input signal 105 is delayed by means of continuous time all-pass filter (APF), where the delay provided by the filter matches the delay in the ADC-DAC path. The residue signal (ADC quantization noise, non-linearity and sampling images) is further filtered (LPF) and amplified (G) before it is relayed to the subsequent stages 102, 103, where the same operation is repeated. Finally, the output of the last stage 103 is digitized by a SAR ADC and the final output $Y_{out}$ is obtained by combining the digital output of each stage 101, 102, 103, 104 in digital compensation filters $H_k(z)$. Ideally, the errors related to the front-end ADCs are cancelled.

Figure 2:
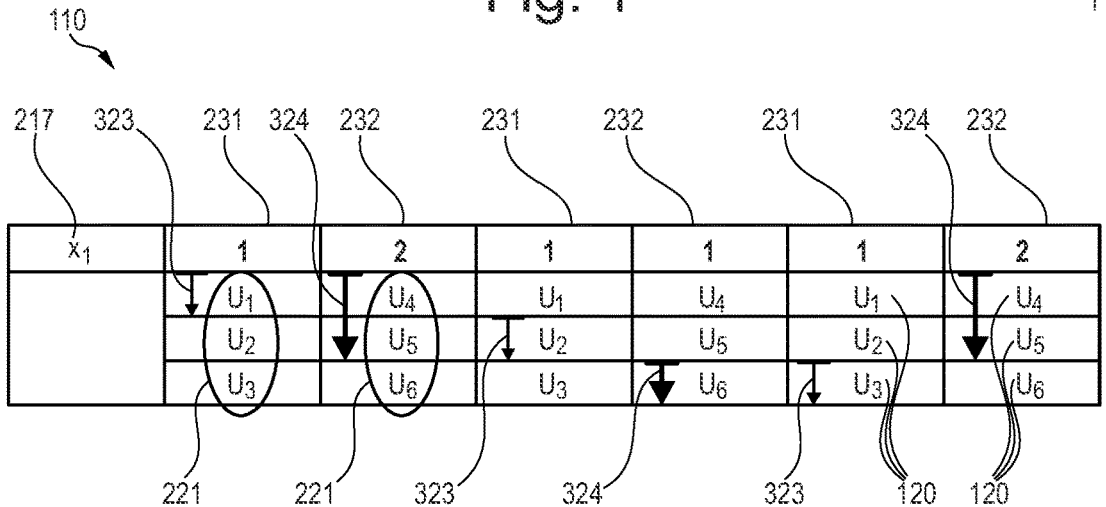
FIGS. 2 and 3 show an algorithm for selecting subsequent sets of unit elements for a first digital-to-analog converter and a second digital-to-analog converter, respectively, according to an exemplary embodiment of the present disclosure.
Figure 3:
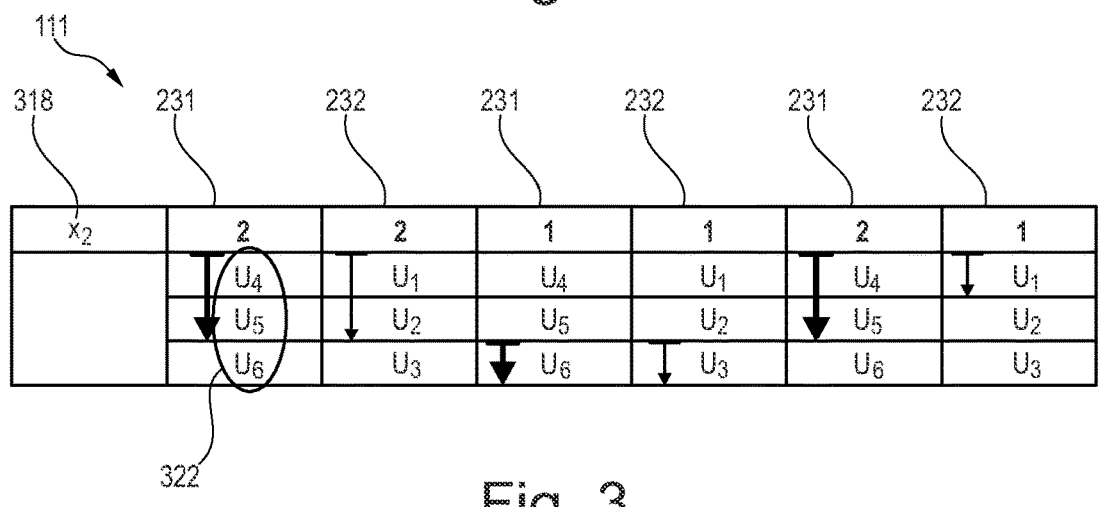

FIGS. 2 and 3 show an algorithm for selecting subsequent sets of unit elements 221 for a first digital-to-analog converter 110 and corresponding subsequent further sets of unit elements 322 for a second digital-to-analog converter 111. The sets of unit elements 221 and corresponding further sets of unit elements 322 each comprise three unit elements 120: $U_1$, $U_2$, $U_3$ or $U_4$, $U_5$, $U_6$. When the switching circuitry is in a first switching state 231, a first set of unit elements $U_1$, $U_2$, $U_3$ forms part of the first digital-to-analog converter 110 and a second set of unit elements $U_4$, $U_5$, $U_6$ forms part of the second digital-to-analog converter 111. When the switching circuitry is in a second switching state 232, the second set of unit elements forms part of the first digital-to-analog converter 110 and the first set of unit elements forms part of the second digital-to-analog converter 111. In the illustrated example, the respective sets of unit elements are selected independently of an input value 217 of an input signal of the first digital-to-analog converter 110 and independently of a further input value 318 of a further input signal of the second digital-to-analog converter 111.

A first pointer 323 associated with the first DAC 110 and a second pointer 324 also associated with the first DAC 110 memorize a previous usage by the first DAC 110 of unit elements 120 of the first set of unit elements and of unit elements 120 of the second set of unit elements, respectively. The number of unit elements used for subsequent input signals depends on the respective input value 217 corresponding to the number of unit elements that the pointer advances. For example, the pointer advances by one unit element, if the input value 217 is one, and advances by two unit elements, if the input value 217 is two. Similarly, it advances by zero or three unit elements, if the input value 217 is zero or three, respectively. The second DAC 111 is associated with analogous first and second pointers as shown in FIG. 3.

In FIGS. 2 and 3, some concepts are illustrated for the sake of simplicity considering only two DACs 110, 111 included in a circuit 100, for example in respective front-end stages of a pipeline converter. The linear gain errors of the DACs leak the quantization errors to the output. Consider that each DAC has a linear gain error $e_g$, such that the linear gain error of the first DAC is $e_{g1}$ and the linear gain error of the second DAC is $e_{g2}$, etc. Then, the output is given by:

$$V_{out} = G^4 V_{in}(1 - e_{g1} + e_{g1}e_{g2} - e_{g1}e_{g2}e_{g3} + e_{g1} + e_{g2}e_{g3}e_{g4}) + G^4$$
$$Q_1(-e_{g1} + e_{g2} + e_{g1}e_{g2} - e_{g2}e_{g3} - e_{g1}e_{g2}e_{g3} + e_{g2}e_{g3}e_{g4} + e_{g1}e_{g2}e_{g3}e_{g4}) +$$
$$G^3\ Q_2(-e_{g2} + e_{g3} + e_{g2}e_{g3} - e_{g3}e_{g4} - e_{g2}e_{g3}e_{g4}) +$$
$$G^2\ Q_3(-e_{g3} + e_{g4} + e_{g3}e_{g4}) + G\ Q_4(-e_{g4}) + Q_{BE}$$

G is the inter-stage gain and $Q_{1,2,3,4}$ are quantization errors of the front-end stages. $Q_{BE}$ is the quantization error of the back-end stage. The leakage of the front-end quantization errors can be minimized, if the DAC gain errors of the front-end converter are all equal. Then, the output reduces to:

$$V_{out} = G^4 V_{in}(1 - e_g + e_g^2 - e_g^3 + e_g^4) + \\ G^4 Q_1 e_g^4 - G^3 Q_2 e_g^3 + G^2 Q_3 e_g^2 - G Q_4 e_g + Q_{BE}$$

The proposed DWA technique is based on the idea of making the linear gain errors of the DACs equal on average by noise shaping the errors that deviate from the average value. More precisely, our goal is to make the gain error of each coarse DAC, i.e. each DAC of the front-end stages, equal to $e_g = (e_{g1} + e_{g2} + e_{g3} + e_{g4})/4$ and noise shape the errors that deviate from this value ($e_{g1} - e_g$ for the first coarse DAC and $e_{g2} - e_g$ for the second coarse DAC, etc). When these errors are turned into white noise, the SFDR (spurious free dynamic range) and HDx (harmonic distortion) of the converter are improved but at the cost of SNR (signal-to-noise ratio). By contrast, when the errors are noise shaped, the SNR can be improved.

Consider the DAC element array or unit element array of the front-end DACs, i.e. $DAC_{array}$, in the following illustrated for a pipeline converter having four stages each with a resolution of two bits:

| $U_1$ | $U_2$ | $U_3$ |
| $U_4$ | $U_5$ | $U_6$ |
| $U_7$ | $U_8$ | $U_9$ |
| $U_{10}$ | $U_{11}$ | $U_{12}$ | where, the first row $U_1$, $U_2$, $U_3$ represents the elements of the first DAC and the second row $U_4$, $U_5$, $U_6$ represents the elements of the second DAC, etc. The DAC output of the first stage is built up by using the first K unit elements that appear in the first row and the DAC output of the second stage is built up by using the first K unit elements that appear in the second row, etc. For example, if the input of the first stage is 1 then element $U_1$ is used and if the input of the third stage is 2, then elements $U_7$ and $U_8$ are used.

A DWA technique of an exemplary embodiment works as follows: Firstly, the rows of the $DAC_{array}$ will be swapped in a specific manner to achieve first order noise shaping of the gain errors. Furthermore, the location of the unit elements in each row will be rearranged to achieve first order noise shaping of the INL errors.

In the following, firstly, the noise shaping of the INL errors is discussed and then the noise shaping of the gain errors.

Generally, the INL errors noise shaping of a DAC is done by selecting the elements of the DAC sequentially based on the input and a pointer. Therefore, four pointers are needed, one for each DAC:

$p_1(n) = (p_1(n-1) + x_1(n-1)) \bmod 3$ $p_2(n) = (p_2(n-1) + x_2(n-1)) \bmod 3$ $p_3(n) = (p_3(n-1) + x_3(n-1)) \bmod 3$ $p_4(n) = (p_4(n-1) + x_4(n-1)) \bmod 3$ For the sake of illustration, consider the first two stages only. Basic DWA element selection for the first and second stages is carried out using always the same set of unit elements for each DAC of each stage and a single pointer for each DAC. For example, the set $U_1$, $U_2$, $U_3$ is always used for the first DAC and the set $U_4$, $U_5$, $U_6$ is always used for the second DAC. The respective pointer advances depending on the input value of the respective DAC, e.g. if the input value is 0, 1, 2 or 3 by the same number of unit elements.

However, in the embodiment illustrated in FIGS. 2 and 3, the DAC output of each stage can be built up by using any row in the $DAC_{array}$ and therefore, the INL errors that appear at each stage will be different depending on the selected row. In order to maintain the noise shaping, we have to put these errors in a hold state before they can be summed to zero. For example, assume that the first two rows of the $DAC_{array}$ will be swapped each clock cycle. Then the element selection according to the proposed DWA technique is shown in FIGS. 2 and 3 for the first stage comprising the first DAC 110 and the second stage comprising the second DAC 111, respectively. FIG. 2 shows element selection for the first stage according to the embodiment and FIG. 3 shows element selection for the second stage according to the embodiment.

An underlying concept is that one has to keep track of all the errors that appear in each stage. As shown in FIG. 2, two different sets of elements appear at the first stage, i.e., elements $U_1$, $U_2$ $U_3$ and elements $U_4$, $U_5$, $U_6$. Therefore, two pointers 323, 324 are needed for each set of element and each pointer 323, 324 has to continue from its last value. This scheme can be further extended to include all four stages. This noise shaping scheme ensures that each set of elements is linearized. This results in residual linear gain errors $e_{g1}$, $e_{g2}$, $e_{g3}$ and $e_{g4}$ for each set of elements. Next, with respect to FIGS. 4 and 5, the noise shaping of the gain errors is discussed.

Figure 4:
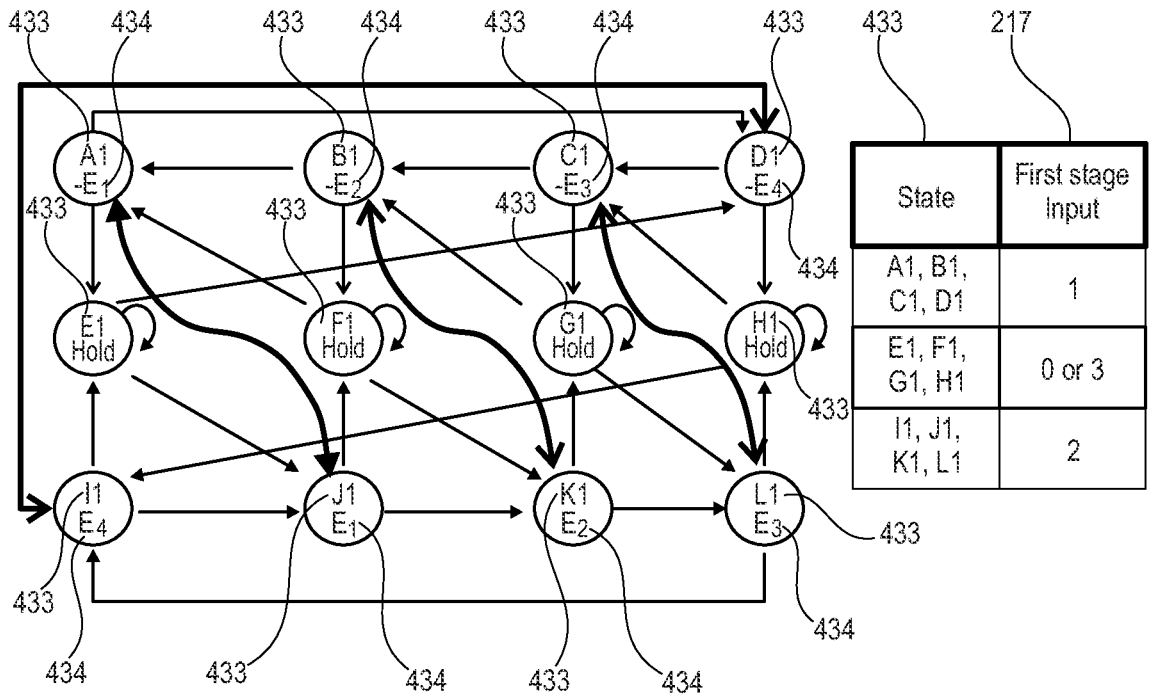
FIGS. 4 and 5 in combination show an algorithm for selecting subsequent sets of unit elements for a first digital-to-analog converter according to an exemplary embodiment of the present disclosure.
Figure 5:
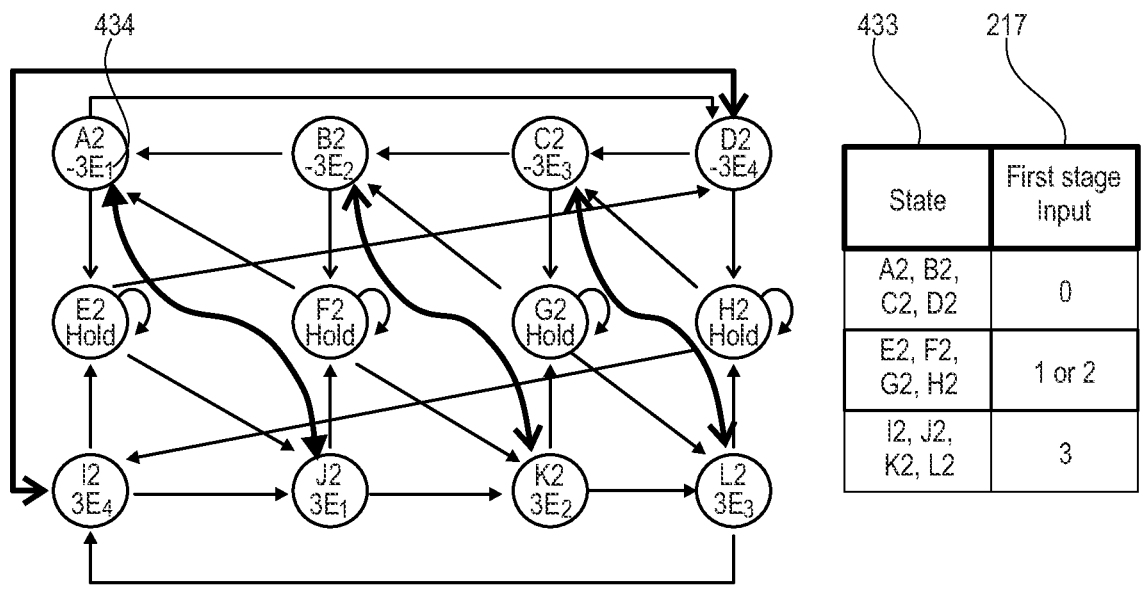

FIGS. 4 and 5 in combination show an algorithm for selecting subsequent sets of unit elements for a first digital-to-analog converter 110. The algorithm relies on two pointers or finite state machines illustrated in FIGS. 4 and 5, respectively.

FIG. 4 shows a number of switching states 433: A1, B1, C1, D1, E1, F1, G1, H1, I1, J1, K1, L1. Switching states 433 are chosen based on input values of the first stage or corresponding input values 217 of the first DAC 110 as well as based on arrows between states 433 shown on the left side of FIG. 4. The arrows determine, which subsequent state is chosen based on a previous state as well as on a respective (present) input value 217. For example, if the previous state was A1 and the present input value is 1, then D1 will be selected as (present) state. Each of the states A1, B1, C1, D1, I1, J1, K1, L1 is associated with a respective (gain) error 434. Each of the states E1, F1, G1, H1 is a hold state, for which the second pointer or state machine of FIG. 5 is used to determine the switching state, the set of elements forming part of the first DAC and respective errors.

Similarly, FIG. 5 shows a number of switching states 433: A2, B2, C2, D2, E2, F2, G2, H2, I2, J2, K2, L2. Switching states 433 are chosen based on input values of the first stage or corresponding input values 217 of the first DAC 110 as well as based on arrows between states 433 shown on the left side of FIG. 5. The arrows determine, which subsequent state is chosen based on a previous state as well as on a respective (present) input value 217. For example, if the previous state was A2 and the present input value is 0, then D2 will be selected as (present) state. Each of the states A2, B2, C2, D2, I2, J2, K2, L2 is associated with a respective (gain) error 434. Each of the states E2, F2, G2, H2 is a hold state, for which the first pointer or state machine of FIG. 4 is used to determine the switching state, the set of elements forming part of the first DAC and respective errors.

By the algorithm depicted in FIGS. 4 and 5, noise shaping of the gain errors at the first stage is achieved. For the noise shaping of the gain errors, four different options will be discussed in the following:

Option 1: Noise shaping of the gain errors at the first stage. Converting the gain errors at other stages into white noise.

Option 2: Noise shaping of the gain errors at the first and second stages. Converting the gain errors at other stages into white noise.

Option 3: Noise shaping of the gain errors at the first three stages. Converting the gain errors at the last stage into white noise.

Option 4: Noise shaping of the gain errors at all stages.

In all options listed above, the average gain error of each stage will be made equal to the same value $e_g=(e_{g1}+e_{g2}+e_{g3}+e_{g4})/4$.

The rows in DAC array are swapped to achieve first order noise shaping of the gain errors. More specifically, the errors are noise shaped that deviate from the common value $e_g$. When the set of elements $U_1$, $U_2$, $U_3$ is selected for any row, the error is $e_{g1}-e_g$. when the elements $U_4$, $U_5$, $U_6$ are used in any row, the error is $e_{g2}-e_g$. Similarly, we have $e_{g3}-e_g$ and $e_{g4}-e_g$ for the set of elements $U_7$, $U_8$, $U_9$ and $U_{10}$, $U_{11}$, $U_{12}$. Based on the selected set of elements and the DAC input, the errors can be written as follows:

$$y_{error}[0]=3/4(-3e_{g1}+e_{g2}+e_{g3}+e_{g4})V_{lsb}=-3E_1$$

$$y_{error}[0]=3/4(e_{g1}-3e_{g2}+e_{g3}+e_{g4})V_{lsb}=-3E_2$$

$$y_{error}[0]=3/4(e_{g1}+e_{g2}-3e_{g3}+e_{g4})V_{lsb}=-3E_3$$

$$y_{error}[0]=3/4(e_{g1}+e_{g2}+e_{g3}-3e_{g4})V_{lsb}=-3E_4$$

$$y_{error}[1]=1/4(-3e_{g1}+e_{g2}+e_{g3}+e_{g4})V_{lsb}=-E_1$$

$$y_{error}[1]=1/4(e_{g1}-3e_{g2}+e_{g3}+e_{g4})V_{lsb}=-E_2$$

$$y_{error}[1]=1/4(e_{g1}+e_{g2}-3e_{g3}+e_{g4})V_{lsb}=-E_3$$

is used, etc. For example, if the DAC input is 0 and the elements $U_7$, $U_8$, $U_9$ are used to produce the output of the DAC, then the error is $-3E_3$. Note that $E_1+E_2+E_3+E_4=0$.

In option 1, to be explained in the following, the objective is to noise shape the gain errors at the first stage and to convert the gain errors at other stages into white noise. First order noise shaping of the gain errors at the first stage can be achieved by making the sum of the errors equal to zero as fast as possible ($E_1+E_2+E_3+E_4=0$). This will depend on the input of the first stage or input of the first DAC and will be done by using two pointers illustrated in FIGS. 4 and 5, respectively.

The first pointer illustrated in FIG. 4 is used when the input of the first stage is 1 or 2. The second pointer illustrated in FIG. 5 is used when the input of the first stage is 0 or 3. The pointers decide which row should be used to produce the output of the first stage, i.e., which set of elements will appear at the first row in the DAC$_{array}$. Finally, the remaining other rows will be swapped randomly to convert their errors into white noise at the remaining stages. The working of the pointers can be described by finite state machine diagrams. FIGS. 4 and 5 show the finite state machines that illustrate the working of the first and second pointer, respectively.

When the input of the first stage is 1 or 2, then the first pointer is activated, while the second pointer will be in one of the "hold" states. Similarly, if the input is 0 or 3, then the second pointer leaves the hold state and the first pointer goes to a hold state. Table 1 below shows the element selection of the first row in DAC$_{array}$ based on the finite state machines of FIGS. 4 and 5 for arbitrary input values. The unit element sets of the remaining rows in the DAC$_{array}$ will be assigned randomly.

TABLE 5

Element selection for the first row in DAC$_{array}$. First column represents initial values.

| | First stage Input | | | | | |
|---|---|---|---|---|---|---|
| | 2 | 2 | 3 | 2 | 3 | 2 |
| $1^{st}$ pointer state | J1 | K1 | G1 (Hold) | L1 | H1 (Hold) | I1 |
| $2^{nd}$ pointer state | E2 (Hold) | E2 (Hold) | J2 | F2 (Hold) | K2 | G2 (Hold) |
| $y_{error}$ | $E_1$ | $E_2$ | $3E_1$ | $E_3$ | $3E_2$ | $E_4$ |
| First row elements | $U_1, U_2, U_3$ | $U_4, U_5, U_6$ | $U_1, U_2, U_3$ | $U_7, U_8, U_9$ | $U_4, U_5, U_6$ | $U_{10}, U_{11}, U_{12}$ |

$$y_{error}[1]=1/4(e_{g1}+e_{g2}+e_{g3}-3e_{g4})V_{lsb}=-E_4$$

$$y_{error}[2]=1/4(3e_{g1}-e_{g2}-e_{g3}-e_{g4})V_{lsb}=E1$$

$$y_{error}[2]=1/4(-e_{g1}+3e_{g2}-e_{g3}-e_{g4})V_{lsb}=E2$$

$$y_{error}[2]=1/4(-e_{g1}-e_{g2}+3e_{g3}-e_{g4})V_{lsb}=E_3$$

$$y_{error}[2]=1/4(-e_{g1}-e_{g2}-e_{g3}+3e_{g4})V_{lsb}=E4$$

$$y_{error}[3]=3/4(3e_{g1}-e_{g2}-e_{g3}-e_{g4})V_{lsb}=3E_1$$

$$y_{error}[3]=3/4(-e_{g1}+3e_{g2}-e_{g3}-e_{g4})V_{lsb}=3E_2$$

$$y_{error}[3]=3/4(-e_{g1}-e_{g2}+3e_{g3}-e_{g4})V_{lsb}=3E_3$$

$$y_{error}[3]=3/4(-e_{g1}-e_{g2}-e_{g3}+3e_{g4})V_{lsb}=3E_4$$

$E_1$ represents the error if the selected set of elements is $U_1$, $U_2$, $U_3$ and $E_2$ is the error if the set of elements $U_4$, $U_5$, $U_6$ In option 1, the first row in DAC$_{array}$ is chosen based on the value of the first stage input. The other rows are swapped randomly. This results in first order noise shaping of the gain errors at the first stage. However, at other stages the gain errors are turned into white noise.

In option 2, to be explained in the following, the objective is to noise shape the gain errors of the first and second stages, while converting the gain errors at the third and fourth stages into white noise. In order to noise shape the errors at the second stage, we have to select the set of elements that appears at the second row in DAC$_{array}$ based on the input of the second stage. Applying the same switching scheme of option 1 to the second stage is not possible because it might happen that the same set of elements is chosen for the first and the second rows, which is not feasible.

In option 1, the purpose is to add the errors to zero as soon as possible. However, one is not restricted to choose the set of elements according to the finite stage machines in FIGS. 4 and 5 only. The pointer represented by the finite state machine is a simple way to achieve noise shaping, but it is not the only way. For example, assume the state J1 is initially chosen when the input is 2. If the next input is 2, we are not restricted to choose state K1 as shown in FIG. 4. Actually, we can choose any state from the remaining states (K1, L1, I1). Assume, state L1 has been chosen randomly and the next input is 2, then we have to choose one state from the remaining states (K1, I1). We can continue this until all states are chosen and the error sums to zero. Once this happens, we can start again and choose one state from all available states. Consider another example where the input is 1, 1, 2, 2. Assume the state J1 is initially chosen, the next state could be chosen from the remaining states (K1, L1, I1). Assume I1 is chosen. Then the next state could be chosen from states A1 or D1. If A1 is chosen, then the next state should be D1.

The above concept can be used to noise shape the gain errors at the first and second stages based on their input. Firstly, based on the input of the first stage, we generate all possible states that can be used at the first stage, i.e., all possible set of elements that can be used in the first row in the $DAC_{array}$. Also, based on the input of the second stage, we generate all possible sets of elements that can be used in the second row in the $DAC_{array}$. Then, we combine all possible options and generate a unique solution. Based on the solution, unit elements are assigned to the rows of the $DAC_{array}$. The elements of the third and fourth rows may be selected randomly from the remaining sets of elements.

For example, assume that unit elements $U_4$, $U_5$, $U_6$ or elements $U_{10}$, $U_{11}$, $U_{12}$ can be used in the first row of $DAC_{array}$. Also, assume that only elements $U_4$, $U_5$, $U_6$ can be used in the second row. Then, we choose elements $U_{10}$, $U_{11}$, $U_{12}$ for the first row and elements $U_4$, $U_5$, $U_6$ for the second row. Furthermore, the elements in the third and fourth rows will be chosen randomly from element sets $U_1$, $U_2$, $U_3$ and $U_7$, $U_8$, $U_9$. However, it can happen that there is only one possible set of unit elements for the first and the second stages and that this set is the same. For example, the set $U_1$, $U_2$, $U_3$ is the only possible solution that needs to be used in the first and second rows. In this case, we choose this set for the first stage and we choose random unit element sets for the other stages. In other words, we always give priority to the first stage as it is more important than the second stage.

For options 3 and 4, the concept of option 2 is extended to include the third and fourth stages. Specifically, for option 3, sets of elements are selected so that the gain errors at the first three stages are noise-shaped, while the gain error of the last stage is converted into white noise. For option 4, all sets of elements are selected so that the gain errors are noise shaped at all stages, if possible. In general, priority for selecting sets of elements is given to the first stage and then to the second stage, etc.

Finally, option 5 is an algorithm, where the gain errors of all stages are converted into white noise. This can be achieved by randomly swapping or assigning sets of elements to all rows of the $DAC_{array}$, including the first row.

Figure 6:
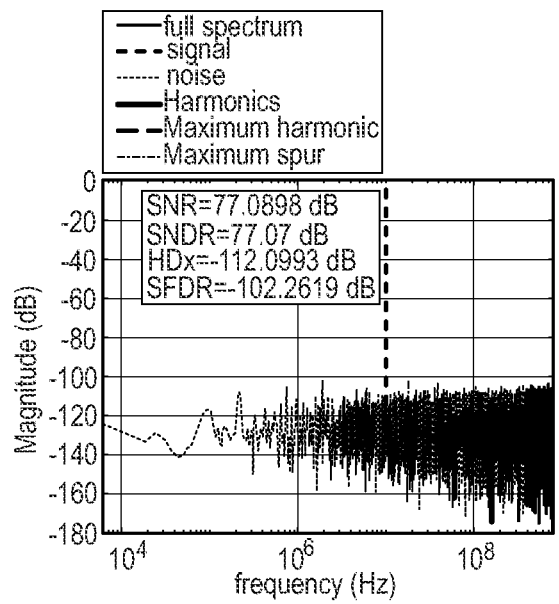
FIGS. 6 and 7 show, for comparison, the output spectrum of a pipeline converter with ideal DACs and input signals of 10 MHz and 380 MHz, respectively.
Figure 7:
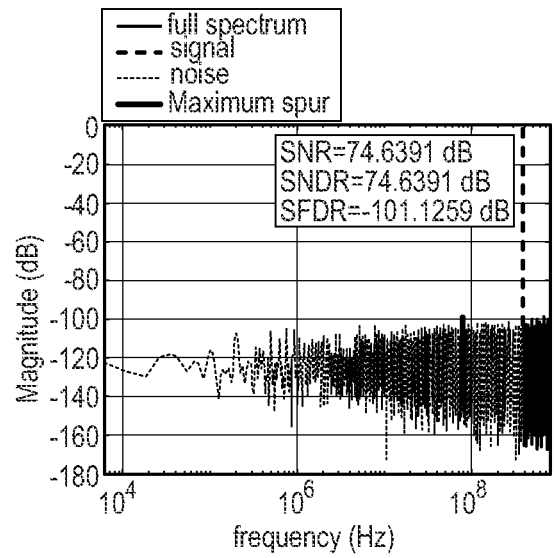

FIGS. 6 and 7 show, for comparison, the output spectrum of pipeline converters with ideal DACs and input signals or full scale input tones of frequencies 10 MHz and 380 MHz, respectively.

In practice, the DACs will not be ideal, but will exhibit errors caused by mismatching between its unit elements. The actual value of each unit element is assumed to follow a Gaussian distribution with certain standard deviation a. The DAC errors due to element mismatch can be viewed as introducing constant gain error e g and an additive error term $e_{DAC}$ [n] that is a deterministic non-linear function of the DAC input n. First order DWA algorithms aim to make $e_{DAC}$ [n] uncorrelated with the DAC input while ensuring that $e_{DAC}$ [n] has a first-order high pass shape. This means that the PSD (power spectral density) of $e_{DAC}$ [n] should be zero at ω=0 rad/s and that the PSD is free of spurious tones and rises at 20 dB/decade as ω increases from zero.

A general and direct method to realize DWA is, where the DAC elements are selected sequentially by means of a pointer p(n). The pointer points to the next available unused DAC element and is described by the following equation:

$$p(n),(p(n-1)+x(n-1)) \bmod N$$

where x(n) is the DAC input and N is the number of DAC elements. This cyclic selection of DAC elements ensures that the DAC INL errors quickly sum to zero. Therefore, the DAC distortion moves to high frequencies. However, this direct realization of DWA does not make $e_{DAC}$ [n] completely uncorrelated with the DAC input. As a result, the DAC output might show spurious tones and nonlinear artifacts. This tonal behavior depends on the input frequency and amplitude. Tones may be suppressed by methods such as BIDWA, dither, RnDWA, RDWA, etc. The general DWA algorithm or any variation of it aims to linearize the DAC by noise shaping the INL errors. However, after the linearization, the DAC will exhibit a linear gain error e g that cannot be eliminated by any element selection technique.

Figure 8:
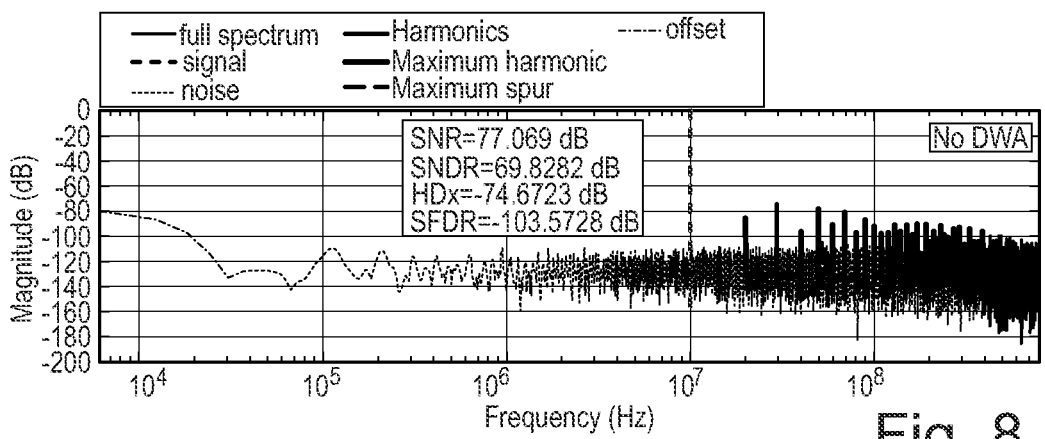
FIGS. 8 and 9 show, for comparison, the output spectrum of a pipeline converter with DACs exhibiting unit element mismatch, an input signal of 10 MHz and with no or with a conventional data weight algorithm procedure, respectively.
Figure 9:
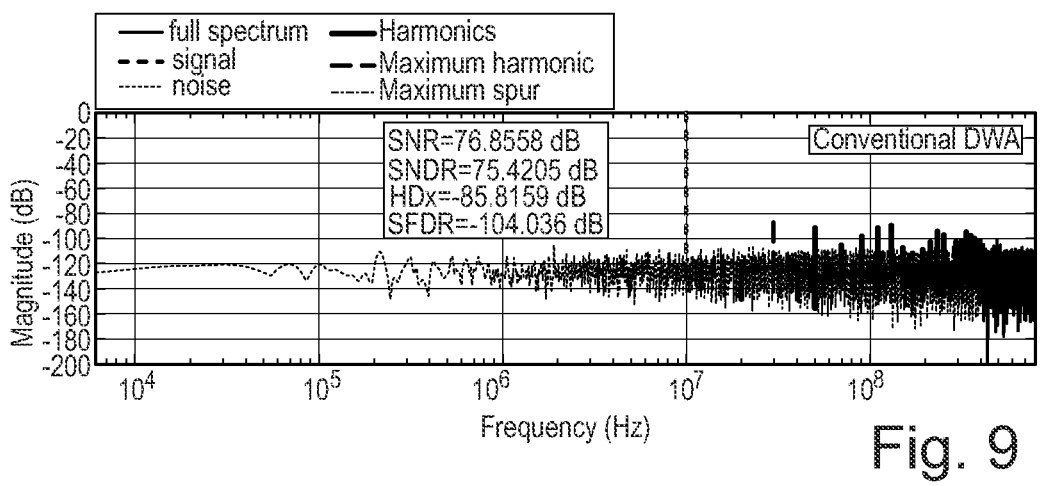

FIGS. 8 and 9 show, for comparison, the output spectrum of pipeline converters with DACs exhibiting unit element mismatch and an input signal of 10 MHz resulting from no data weight algorithm procedure or with a conventional data weight algorithm procedure, respectively. In this example, element mismatch of σ=0.1% has been introduced to all DACs. In comparison with FIG. 6, for example harmonic distortion (HDx) has degraded, which slightly improves when employing the conventional DWA algorithm as shown in FIG. 9.

FIGS. 8 and 9 shows the output spectrum for a 10 MHz input tone, with and without applying the conventional DWA technique, when DAC element mismatch of σ=0.1% is introduced to all DACs. As shown in FIG. 8, mismatch in DAC elements causes harmonic distortion at the output and degrades the linearity performance of the converter. After applying the conventional DWA technique, as shown in FIG. 9, the linearity performance of the converter is still poor. The conventional DWA technique linearizes the DACs. However, the resulting gain error of the DACs leaks the quantization errors of the front-end ADCs to the output and therefore, reduces the linearity performance of the converter.

Figure 10:
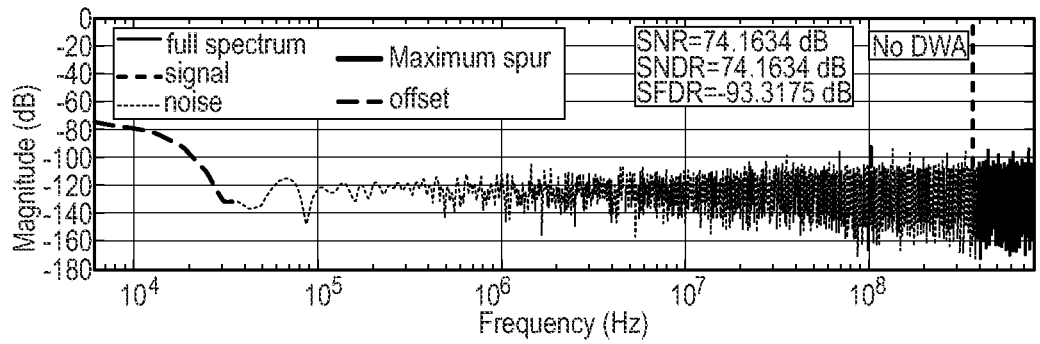
FIGS. 10 and 11 show, for comparison, the output spectrum of a pipeline converter with DACs exhibiting unit element mismatch, an input signal of 380 MHz and with no or with a conventional data weight algorithm procedure, respectively.
Figure 11:
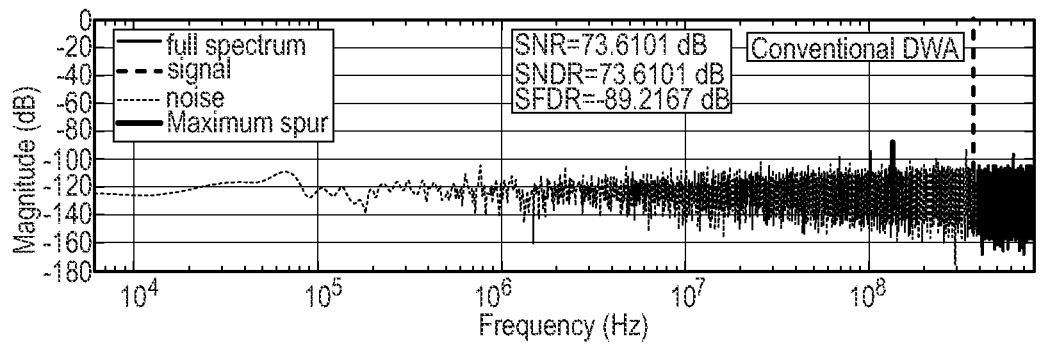

FIGS. 10 and 11 show, for comparison, the output spectrum of pipeline converters with DACs exhibiting mismatch and an input signal of 380 MHz resulting from no data weight algorithm procedure or with a conventional data weight algorithm procedure, respectively. In this example, element mismatch of σ=0.1% has been introduced to all DACs. In comparison with FIG. 7, for example spurious free dynamic range measure (SFDR) has degraded, which slightly improves when employing the conventional DWA algorithm as shown in FIG. 11.

The simulations shown in FIGS. 8 and 9 are repeated for input signal with frequency of 380 MHz. The results are shown in FIGS. 10 and 11. As shown, applying the conventional DWA technique to the DACs is not improving the SFDR performance of the converter as the SFDR is still limited by the linear gain errors of the DACs.

Figure 12:
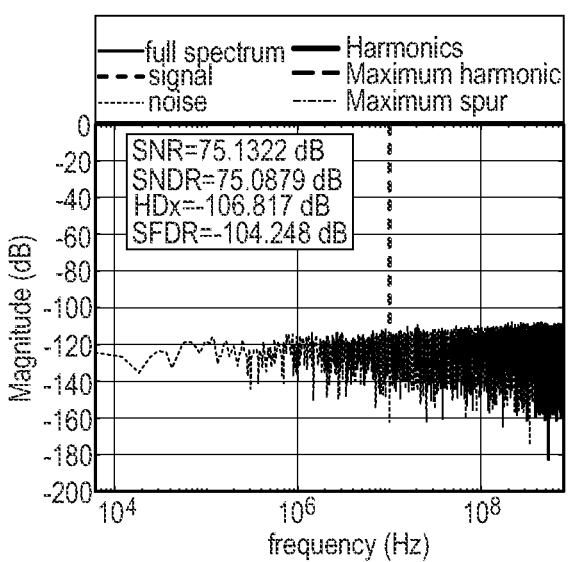
FIGS. 12 and 13 show the output spectrum of a pipeline converter with DACs exhibiting unit element mismatch, input signals of 10 MHz and 380 MHz, respectively, and with a data weight algorithm according to an exemplary embodiment of the present disclosure.
Figure 13:
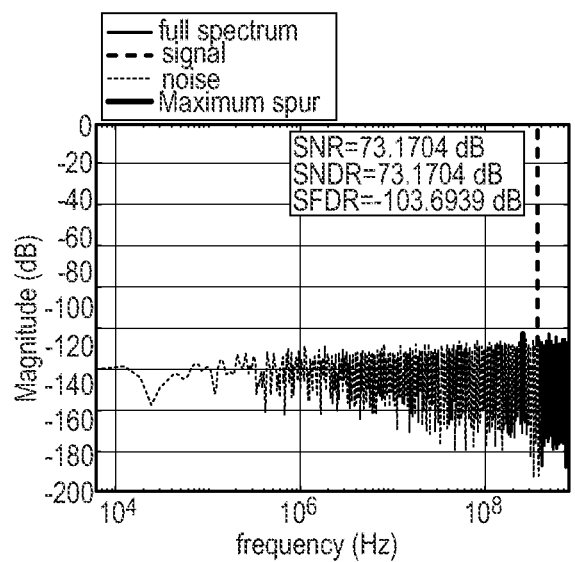

FIGS. 12 and 13 show the output spectrum of pipeline converters with DACs exhibiting mismatch and input signals of 10 MHz and 380 MHz, respectively, resulting from a data weight algorithm according to an exemplary embodiment of the present disclosure. As above, element mismatch of $\sigma=0.1\%$ has been introduced to all DACs. The DWA technique described as option 1 with respect to FIGS. 4 and 5 has been used. The output spectrum shows no spurious tones and nonlinear distortion. This is reflected in the harmonic distortion measure of the graph shown in FIG. 12 and the SFDR measure of the graph shown in FIG. 13.

Figure 14:
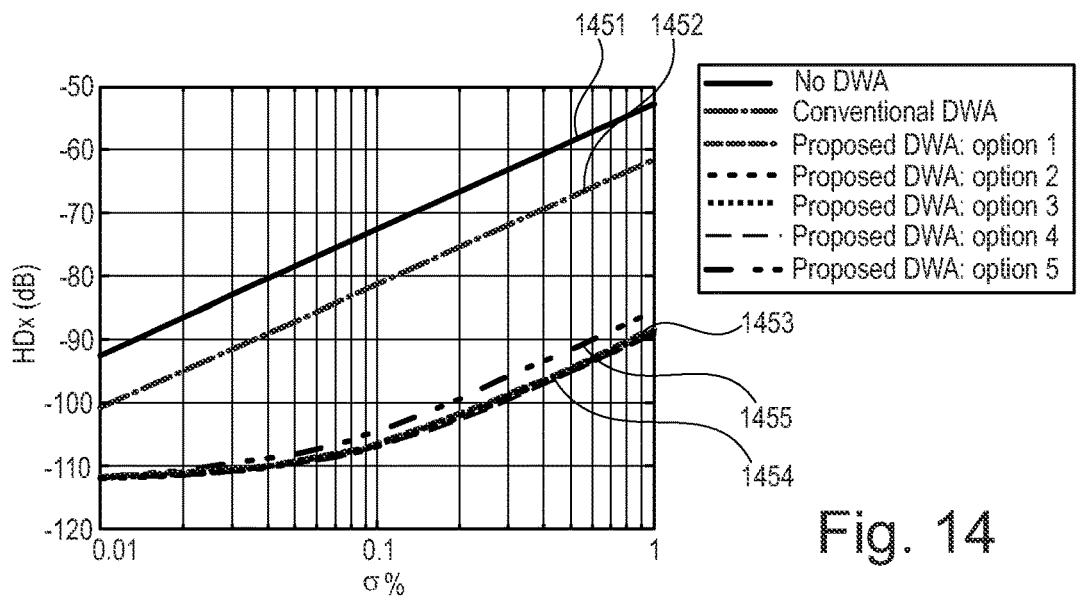
FIG. 14 shows a harmonic distortion (HDx) of an output signal depending on an amount of mismatch between unit elements according to exemplary embodiments of the present disclosure.

FIG. 14 shows a harmonic distortion (HDx) of an output signal depending on an amount of mismatch $\sigma$ between unit elements. Full scale input tone is applied at 10 MHz. All options 1 to 5, as introduced with respect to FIGS. 4 and 5 above, show an improvement with respect to no DWA 1451 or conventional DWA 1452. Option one 1453 and options two to four 1454 show additional improvement over option five 1455. The proposed DWA clearly improves the HDx performance of the converter with option one 1453 being only slightly degraded in comparison with options two to four 1454.

Figure 15:
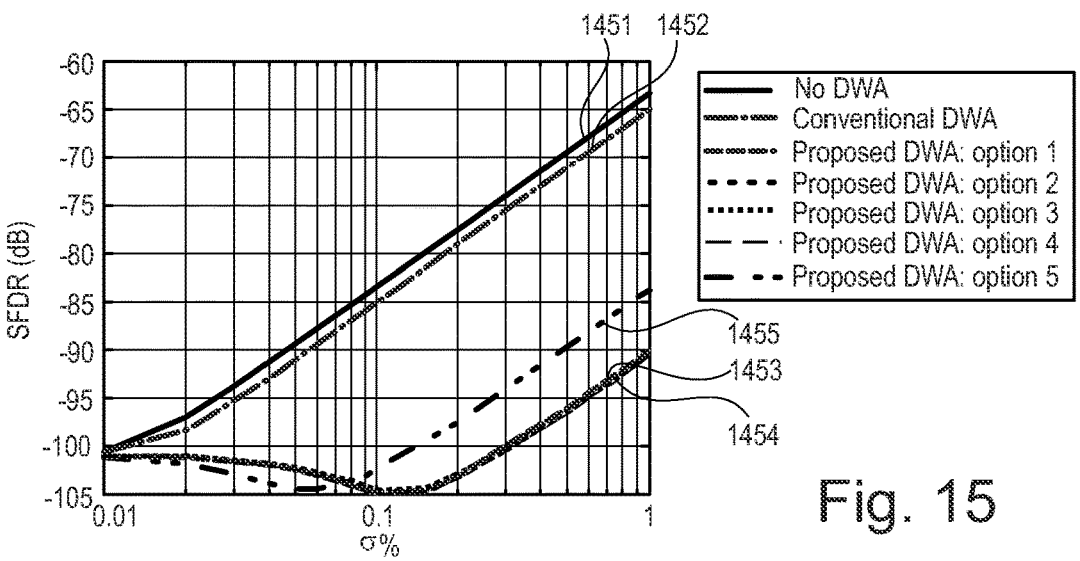
FIG. 15 shows a spurious free dynamic range (SFDR) of an output signal depending on an amount of mismatch between unit elements according to exemplary embodiments of the present disclosure.

FIG. 15 shows a spurious free dynamic range (SFDR) of an output signal depending on an amount of mismatch $\sigma$ between unit elements. Full scale input tone is applied at 380 MHz. All algorithms according to options 1 to 5 show an improvement with respect to no DWA 1451 or conventional DWA 1452. Option one 1453 and options two to four 1454 show additional improvement over option five 1455, at least for larger amounts of mismatch. The proposed DWA clearly improves the SFDR performance of the converter, with option one 1453 being only slightly degraded in comparison with options two to four 1454.

Figure 16:
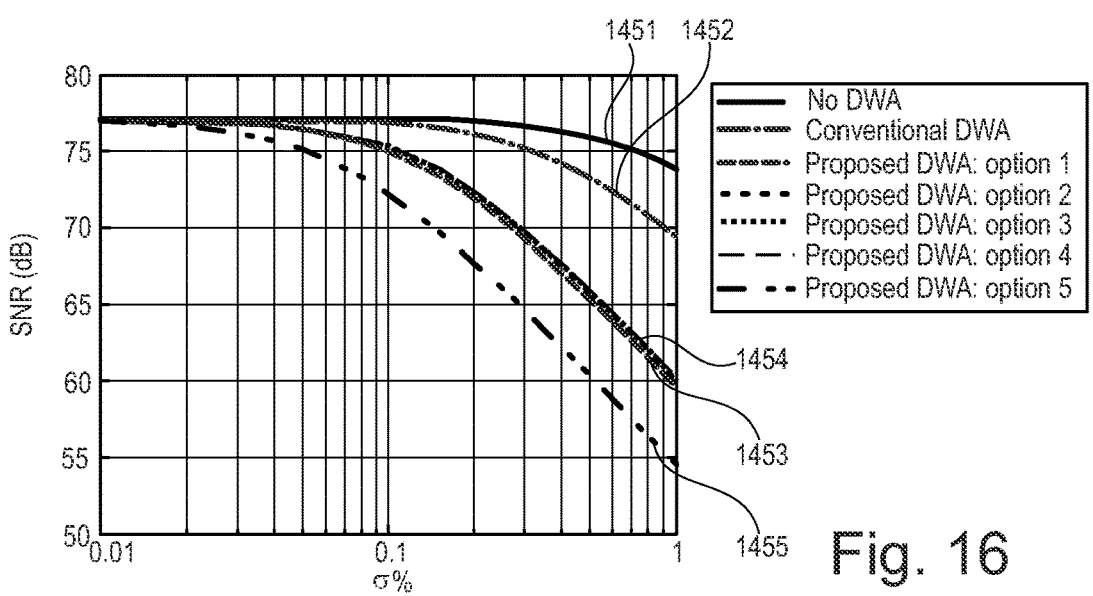
FIG. 16 shows a signal-to-noise ratio (SNR) of an output signal depending on an amount of mismatch between unit elements according to exemplary embodiments of the present disclosure.

FIG. 16 shows a signal-to-noise ratio (SNR) of an output signal depending on an amount of mismatch $\sigma$ between unit elements. Full scale input tone is applied at 10 MHz. The algorithms of options one to four 1453, 1454 show an improvement in signal-to-noise ratio with respect to option five 1455, with the signal-to-noise ratio of option one 1453 being only slightly degraded in comparison with options two to four 1454. Summarizing from FIGS. 14 to 16, option 1 appears sufficient as the other options 2 to 4 do not noticeably improve the performance of the converter.

In this specification, embodiments have been presented in terms of a selected set of details. However, a person of ordinary skill in the art would understand that many other embodiments may be practiced which include a different selected set of these details. It is intended that the following claims cover all possible embodiments.

REFERENCE NUMERALS 100 circuit
101 first stage
102 second stage
103 further stage
104 back-end stage
105 first stage input signal
106 second stage input signal
110 first DAC
111 second DAC
112 further DAC
113 input signal
114 further input signal
115 overall input signal
116 overall output signal
120 unit element
130 switching circuitry
140 control device
217 input value (of first DAC)
221 set of unit elements
231 first switching state
232 second switching state
318 further input value (of second DAC)
322 further set of unit elements
323 first pointer
324 second pointer
433 switching state
434 associated error
1451 no DWA
1452 conventional DWA
1453 option 1
1454 options 2 to 4
1455 option 5

The invention claimed is:

1. A pipeline converter circuit comprising
a first stage that includes a first input configured to receive a first stage input signal, a first output configured to produce a first stage output signal, and a first digital-to-analog converter coupled between the first input and the first output, wherein the first digital-to-analog converter is configured to receive a first digital signal derived from the first stage input signal, and to produce a first analog signal from which the first stage output signal is derived;
a second stage that includes a second input coupled to the first output and configured to receive the first stage output signal, a second output configured to produce a second stage output signal, and a second digital-to-analog converter coupled between the second input and the second output, wherein the second digital-to-analog converter is configured to receive a second digital signal derived from the first stage output signal, and to produce a second analog signal from which the second stage output signal is derived;
a plurality of unit elements; and
switching circuitry coupled to the first and second stages and to the plurality of unit elements, wherein the switching circuitry is adapted so that, in a first switching state, a set of unit elements of the plurality of unit elements forms part of the first digital-to-analog converter, and in a second switching state, the set of unit elements forms part of the second digital-to-analog converter, wherein the set of unit elements includes fewer than all of the unit elements in the plurality of unit elements.

2. The circuit of claim 1, wherein each of the unit elements of the plurality of unit elements comprises at least one electric component.

3. The circuit of claim 2, wherein the at least one electric component is selected from at least one of a group of electric components consisting of a current source, a resistor, and a capacitor.

4. The circuit of claim 1, wherein a size of the set of unit elements is indicative of a number of bits processed by the first digital-to-analog converter.

5. The circuit of claim 1, further comprising
at least one further digital-to-analog converter, wherein the switching circuitry is adapted so that, for each further digital-to-analog converter, the set of unit elements forms part of the further digital-to-analog converter in a respective further switching state of the switching circuitry.

6. The circuit of claim 1, wherein the set of unit elements forming part of the first digital-to-analog converter in the first switching state is selected based on an input value of an input signal received by the first digital-to-analog converter.

7. The circuit of claim 1, wherein the set of unit elements forming part of the first digital-to-analog converter in the first switching state is selected based on a previous set of unit elements that include different unit elements from the first set of unit elements, which formed part of the first digital-to analog converter, when a previous input value of a previous input signal was processed by the first digital-to analog converter.

8. The circuit of claim 1, wherein the switching circuitry is adapted so that, in the first switching state, a further set of unit elements forms part of the second digital-to-analog converter, wherein the set of unit elements includes different unit elements from the further set of unit elements, and the further set of unit elements are selected such that a first average gain error of the first digital-to-analog converter equals a second average gain error of the second digital-to-analog converter.

9. The circuit of claim 1, wherein subsequent sets of unit elements are selected that are different from the set of unit elements to form part of the first digital-to-analog converter when subsequent input signals having respective subsequent input values are received by the first digital-to-analog converter so that respective subsequent deviations from an average error compensate each other.

10. The circuit of claim 1, wherein subsequent sets of unit elements are selected that are different from the set of unit elements to form part of the first digital-to-analog converter when subsequent input signals having respective subsequent input values are received by the first digital-to-analog converter to noise shape a gain error of the first digital-to-analog converter.

11. The circuit of claim 1, wherein subsequent further sets of unit elements are selected randomly that are different from the set of unit elements to form part of the second digital-to-analog converter when subsequent further input signals having respective subsequent further input values are received by the second digital-to-analog converter.

12. The circuit of claim 1, wherein the switching circuitry is configured to electrically connect the set of unit elements to the first digital-to-analog converter in a predetermined order, wherein the order is changed for subsequent input signals.

13. The circuit of claim 1, further comprising a control device configured to operate the switching circuitry.

14. A method of operating a pipeline converter circuit, which comprises a plurality of stages each including a digital-to-analog converter, and a plurality of unit elements, wherein the method comprises the steps of:
setting, at a first time, switching circuitry of the pipeline converter circuit to a first switching state so that a set of unit elements of the plurality of unit elements forms part of a first digital-to-analog converter of a first stage of the plurality of stages, wherein the set of unit elements includes fewer than all of the unit elements in the plurality of unit elements; and
setting, at a different time, the switching circuitry to a second switching state so that the set of unit elements forms part of a second digital-to-analog converter of a second stage of the plurality of stages.

15. The method of claim 14, wherein each of the unit elements of the plurality of unit elements comprises at least one electric component.

16. The method of claim 14, wherein a size of the set of unit elements is indicative of a number of bits processed by the first digital-to-analog converter.

17. The method of claim 14, wherein the set of unit elements forming part of the first digital-to-analog converter in the first switching state is selected based on an input value of an input signal received by the first digital-to-analog converter.

18. The method of claim 14, wherein the set of unit elements forming part of the first digital-to-analog converter in the first switching state is selected based on a previous set of unit elements, which formed part of the first digital-to analog converter, when a previous input value of a previous input signal was processed by the first digital-to analog converter.

19. The method of claim 14, wherein the switching circuitry is adapted so that, in the first switching state, a further set of unit elements that is different from the set of unit elements forms part of the second digital-to-analog converter, wherein the set of unit elements and the further set of unit elements are selected such that a first average gain error of the first digital-to-analog converter equals a second average gain error of the second digital-to-analog converter.

20. The method of claim 14, wherein subsequent sets of unit elements are selected that are different from the set of unit elements to form part of the first digital-to-analog converter when subsequent input signals having respective subsequent input values are received by the first digital-to-analog converter so that respective subsequent deviations from an average error compensate each other.

\* \* \* \* \*